(12) United States Patent
Harrison

(10) Patent No.: US 8,736,475 B1
(45) Date of Patent: May 27, 2014

(54) FIRDAC WITH RTZ/RTO VOLTAGE-MODE ELEMENTS

(71) Applicant: Broadcom Corporation, Irvine, CA (US)

(72) Inventor: Jeffrey Harrison, Carlingford (AU)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/646,879

(22) Filed: Oct. 8, 2012

(51) Int. Cl.
*H03M 1/66* (2006.01)

(52) U.S. Cl.
USPC .......................................... 341/144; 341/143

(58) Field of Classification Search
USPC ..................... 341/144, 143, 155, 150, 152
See application file for complete search history.

(56) References Cited

U.S. PATENT DOCUMENTS

| | | | | |
|---|---|---|---|---|
| 5,008,674 | A * | 4/1991 | Da Franca et al. | 341/150 |
| 5,614,905 | A * | 3/1997 | Crane | 341/146 |
| 6,476,748 | B1 * | 11/2002 | Galton | 341/144 |
| 6,501,408 | B2 * | 12/2002 | Groeneweg | 341/144 |
| 6,734,816 | B2 * | 5/2004 | Morimoto et al. | 341/144 |
| 6,989,779 | B2 * | 1/2006 | Sasaki et al. | 341/144 |
| 7,042,379 | B2 * | 5/2006 | Choe | 341/144 |
| 7,656,333 | B2 * | 2/2010 | Bruin | 341/144 |
| 2013/0207823 | A1 * | 8/2013 | Wyville | 341/144 |

OTHER PUBLICATIONS

Harrison et al., "A multi-bit sigma-delta ADC with an FIR DAC loop filter", IEEJ Intl Analog Workshop, 2000.
Vital et al., "Integrated Mixed-Mode Digital-Analog Filter Converters", IEEE J. Solid-State Circuits Jun. 1990 p. 660+.
Su et al., "A CMOS Oversampling D/A Converter with a Current-Mode Semidigital Reconstruction Filter", IEEE J. Solid-State Circuits Dec. 1993 p. 1224+.
Okamoto et. al. "A Stable High-Order Delta-Sigma Modulator with an FIR Spectrum Distributor", IEEE J. Solid-State Circuits Jul. 1993 p. 730+.
Harrison et. al., "An LC Bandpass ΔΣ ADC with 70dB SNDR Over 20MHz Bandwidth Using CMOS DACs", ISSCC 2012 paper 8.1.
Gao et al., "Excess Loop Delay Effects in Continuous-Time Delta-Sigma Modulators and the Compensation Solution", IEEE Intl Symposium on Circuits & Systems, 1997 p. 65+.
Barkin et al., "A CMOS Oversampling Bandpass Cascaded D/A Converter With Digital FIR and Current-Mode Semi-Digital Filtering", IEEE J Solid-State Circuits Apr. 2004 p. 585+.

* cited by examiner

*Primary Examiner* — Peguy Jean Pierre
(74) *Attorney, Agent, or Firm* — Garlick & Markison; Randy W. Lacasse

(57) ABSTRACT

A FIRDAC with a return-to-zero or return-to-open drive uses multiple DACs receiving delayed copies of a digital input data signal to reduce thermal noise and intersymbol interference to produce a summed analog output. The SNR of sigma-delta ADCs using current-source-based DACs is significantly limited by the thermal noise of the DAC current sources. DACs using a switched voltage connected via a resistor or other passive element are quieter, but in a non-return-to-zero configuration tend to suffer from intersymbol interference if used at GHz clock frequencies. The intersymbol interference can be avoided by using a return-to-zero or return-to-open drive using multiple DACs clocked on successive half clock cycles (a finite-impulse-response DAC).

20 Claims, 9 Drawing Sheets

FIRDAC WITH RTZ/RTO VOLTAGE-MODE ELEMENTS

BACKGROUND OF THE INVENTION

1. Technical Field of the Invention

This invention relates generally to wireless communications and more particularly to circuits used to support wireless communications.

2. Description of Related Art

Communication systems are known to support wireless and wireline communications between wireless and/or wireline communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, 3GPP, LTE, LTE Advanced, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to one or more antennas (e.g., MIMO) and may include one or more low noise amplifiers, one or more intermediate frequency stages, a filtering stage, and a data recovery stage. The low noise amplifier(s) receives inbound RF signals via the antenna and amplifies them. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

Currently, wireless communications occur within licensed or unlicensed frequency spectrums. For example, wireless local area network (WLAN) communications occur within the unlicensed Industrial, Scientific, and Medical (ISM) frequency spectrum of 900 MHz, 2.4 GHz, and 5 GHz. While the ISM frequency spectrum is unlicensed there are restrictions on power, modulation techniques, and antenna gain. Another unlicensed frequency spectrum is the V-band of 55-64 GHz.

In wireless transmitters, digital-to-analog converters (DACs) are implemented in various ways in an attempt to provide low-noise (e.g., thermal noise) analog output signals for amplification and transmission through one or more antennas. Traditionally, this has been achieved by using, for example, a switched-capacitor DAC.

One example of this structure is provided by Vital et al., "Integrated Mixed-Mode Digital-Analog Filter Converters", IEEE J. Solid-State Circuits June 1990 p 660+. However, while providing potentially low thermal noise, the settling can be too slow for GHz clock frequencies. A second arrangement includes non-return-to-zero current DAC cells with the outputs in parallel. In this circuit, summing of outputs follows from Kirchoffs' current law. An example of this structure is provided by Su & Wooley, "A CMOS Oversampling D/A Converter with a Current-Mode Semidigital Reconstruction Filter", IEEE J. Solid-State Circuits December 1993 p. 1224+. This example, however, includes at least two limitations such as nonlinear "intersymbol interference" between outputs of a DAC on successive cycles as well as high thermal noise.

Some early examples of DACs used in delta-sigma or sigma-delta modulators, include: Okamoto et al. "A Stable High-Order Delta-Sigma Modulator with an FIR Spectrum Distributor", IEEE J. Solid-State Circuits July 1993 p. 730+ and Harrison & Weste "A multi-bit sigma-delta ADC with an FIR DAC loop filter", IEEJ Intl Analog Workshop, 2000.

An early example of DACs used in bandpass RF DACs for transmitters including a combination of a DAC with a digital EA modulator, digital subtractor and error DAC is shown in Barkin et al., "A CMOS Oversampling Bandpass Cascaded D/A Converter With Digital FIR and Current-Mode Semi-Digital Filtering", IEEE J Solid-State Circuits April 2004 p. 585+.

An example of a "two-element" DAC is shown in Harrison et al., "An LC Bandpass ΔΣ ADC with 70 dB SNDR Over 20 MHz Bandwidth Using CMOS DACs", ISSCC 2012 paper 8.1 as well as in Gao et al., "Excess Loop Delay Effects in Continuous-Time Delta-Sigma Modulators and the Compensation Solution", IEEE Intl Symposium on Circuits & Systems, 1997 p 65+.

Disadvantages of conventional approaches will be evident to one skilled in the art when presented in the disclosure that follows.

BRIEF DESCRIPTION OF THE SEVERAL VIEWS OF THE DRAWING(S)

DETAILED DESCRIPTION OF THE INVENTION

Figure 1:
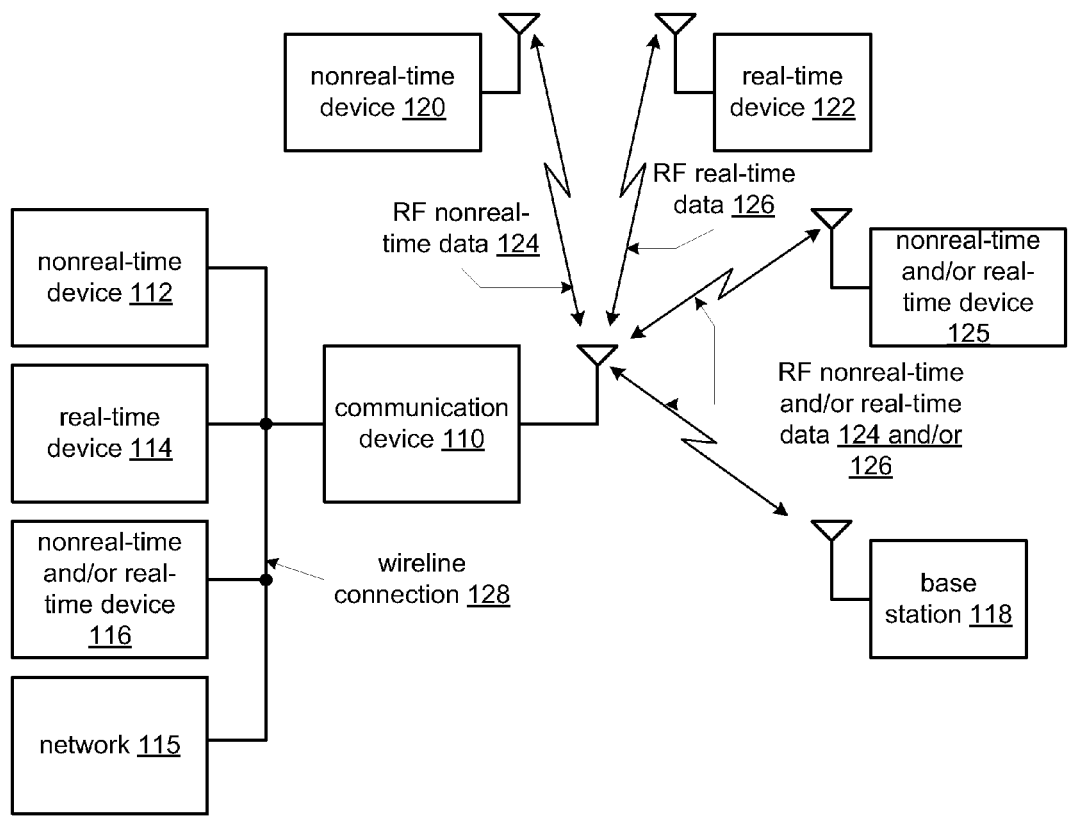
FIG. 1 is a schematic block diagram of an embodiment of a wireless communication system.

FIG. 1 is a schematic block diagram of a communication system in accordance with the technology described herein. In particular, a communication system is shown that includes a communication device 110 that communicates real-time data 126 and/or non-real-time data 124 wirelessly with one or more other devices such as base station 118, non-real-time device 120, real-time device 122, and non-real-time and/or real-time device 125. In addition, communication device 110 can also optionally communicate over a wireline connection with network 115, non-real-time device 112, real-time device 114, and non-real-time and/or real-time device 116.

In an embodiment of the present invention the wireline connection 128 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as WiHD, NGMS, IEEE 802.11a, ac, b, g, n, or other 802.11 standard protocol, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 110.

Communication device 110 can be a mobile phone such as a cellular telephone, a local area network device, personal area network device or other wireless network device, a personal digital assistant, game console, personal computer, laptop computer, or other device that performs one or more functions that include communication of voice and/or data via wireline connection 128 and/or the wireless communication path. Further communication device 110 can be an access point, base station or other network access device that is coupled to a network 115 such as the Internet or other wide area network, either public or private, via wireline connection 128. In an embodiment of the present invention, the real-time and non-real-time devices 112, 114 116, 118, 120, 122 and 125 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 126 includes voice, audio, video and multimedia applications including Internet gaming, etc. The non-real-time data 124 includes text messaging, email, web browsing, file uploading and downloading, etc.

In an embodiment of the present invention, the communication device 110 includes a wireless transceiver that includes one or more features or functions of the present invention. Such wireless transceivers shall be described in greater detail in association with FIGS. 2-11 that follow.

Figure 2:
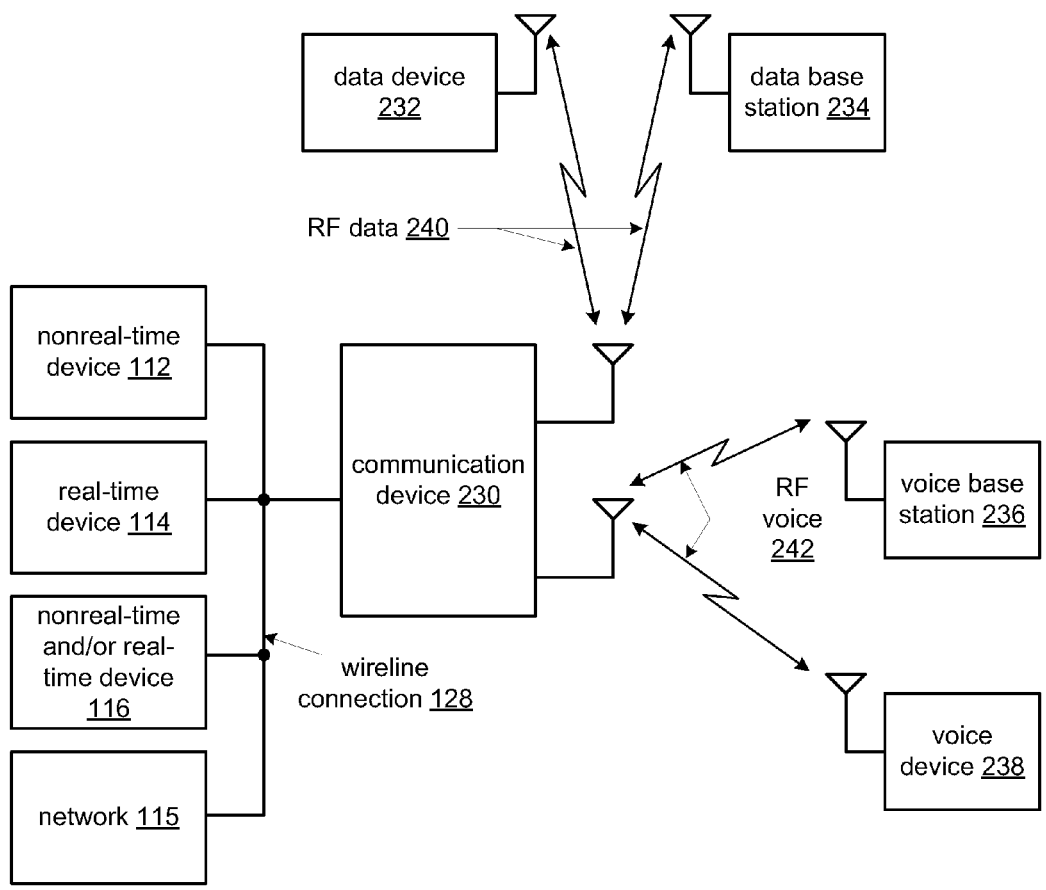
FIG. 2 is a schematic block diagram of another embodiment of a wireless communication system.

FIG. 2 is a schematic block diagram of an embodiment of another communication system in accordance with the present invention. In particular, FIG. 2 presents a communication system that includes many common elements of FIG. 1 that are referred to by common reference numerals. Communication device 230 is similar to communication device 110 and is capable of any of the applications, functions and features attributed to communication device 110, as discussed in conjunction with FIG. 1. However, communication device 230 includes two or more separate wireless transceivers for communicating, contemporaneously, via two or more wireless communication protocols with data device 232 and/or data base station 234 via RF data 240 and voice base station 236 and/or voice device 238 via RF voice signals 242.

Figure 3:
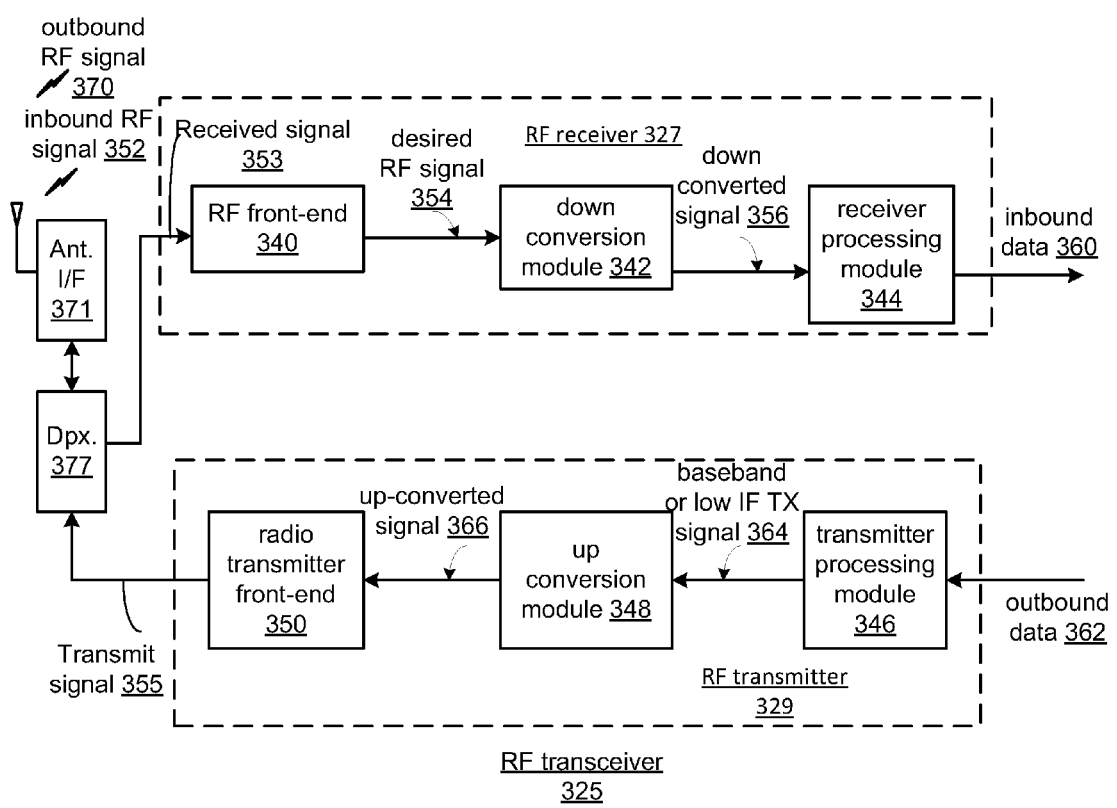
FIG. 3 is a schematic block diagram of an RF transceiver for a wireless communication system.

FIG. 3 is a schematic block diagram of an embodiment of a wireless transceiver 325 in accordance with the present invention. The RF transceiver 325 represents a wireless transceiver for use in conjunction with communication devices 110 or 230, base station 118, non-real-time device 120, real-time device 122, and non-real-time, real-time device 125, data device 232 and/or data base station 234, and voice base station 236 and/or voice device 238. RF transceiver 325 includes an RF transmitter 329, and an RF receiver 327. The RF receiver 327 includes a RF front end 340, a down conversion module 342 and a receiver processing module 344. The RF transmitter 329 includes a transmitter processing module 346, an up conversion module 348, and a radio transmitter front-end 350.

Figure 4:
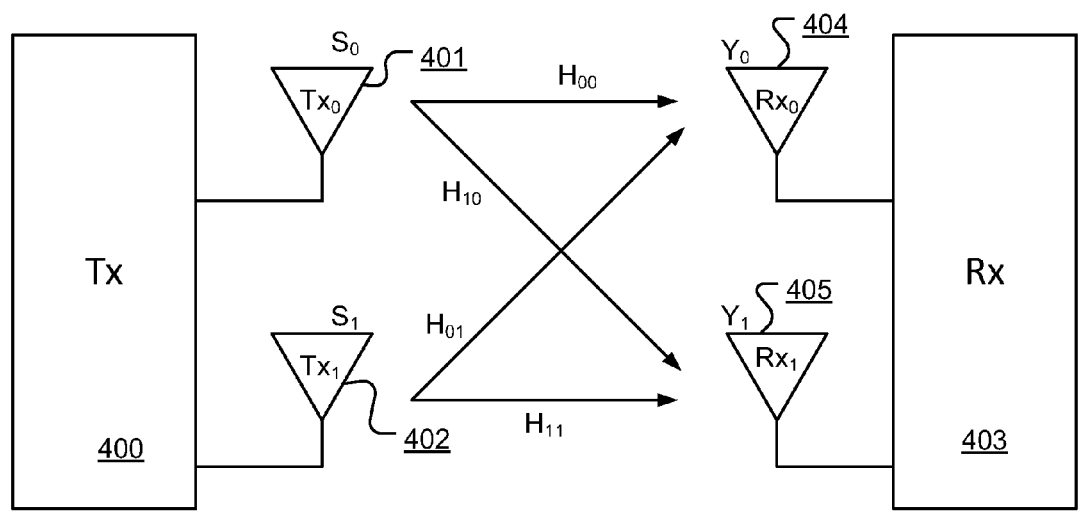
FIG. 4 is a schematic block diagram of a simple two antenna MIMO structure.

As shown, the receiver and transmitter are each coupled to an antenna through an antenna interface 371 and a diplexer (duplexer) 377, that couples the transmit signal 355 to the antenna to produce outbound RF signal 370 and couples inbound signal 352 to produce received signal 353. Alternatively, a transmit/receive switch can be used in place of diplexer 377. While a single antenna is represented in FIG. 3, the receiver and transmitter may share a multiple antenna structure that includes two or more antennas as shown in FIG. 4, discussed in greater detail hereafter.

In operation, the RF transmitter 329 receives outbound data 362. The transmitter processing module 346 packetizes outbound data 362 in accordance with a millimeter wave protocol or wireless telephony protocol, either standard or proprietary, to produce baseband or low intermediate frequency (IF) transmit (TX) signals 364 that includes an outbound symbol stream that contains outbound data 362. The baseband or low IF TX signals 364 may be digital baseband signals (e.g., have a zero IF) or digital low IF signals, where the low IF typically will be in a frequency range of one hundred kilohertz to a few megahertz. Note that the processing performed by the transmitter processing module 346 can include, but is not limited to, scrambling, encoding, puncturing, mapping, modulation, and/or digital baseband to IF conversion.

The up conversion module 348 includes a digital-to-analog conversion (DAC) module, a filtering and/or gain module, and a mixing section. The DAC module converts the baseband or low IF TX signals 364 from the digital domain to the analog domain. The filtering and/or gain module filters and/or adjusts the gain of the analog signals prior to providing it to the mixing section. The mixing section converts the analog baseband or low IF signals into up-converted signals 366 based on a transmitter local oscillation.

The radio transmitter front end 350 includes a power amplifier and may also include a transmit filter module. The power amplifier amplifies the up-converted signals 366 to produce outbound RF signals 370, which may be filtered by the transmitter filter module, if included. The antenna structure transmits the outbound RF signals 370 via an antenna interface 371 coupled to an antenna that provides impedance matching and optional band pass filtration.

The RF receiver 327 receives inbound RF signals 352 via the antenna and antenna interface 371 that operates to process the inbound RF signal 352 into received signal 353 for the receiver front-end 340. In general, antenna interface 371 provides impedance matching of antenna to the RF front-end 340, optional band pass filtration of the inbound RF signal 352.

The down conversion module 342 includes a mixing section, an analog to digital conversion (ADC) module, and may also include a filtering and/or gain module. The mixing section converts the desired RF signal 354 into a down converted signal 356 that is based on a receiver local oscillation, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 356 that includes an inbound symbol stream. Note that the ordering of the ADC module and filtering and/or gain module may be switched, such that the filtering and/or gain module is an analog module.

The receiver processing module 344 processes the baseband or low IF signal 356 in accordance with a millimeter wave protocol, either standard or proprietary, to produce inbound data 360 such as probe data received from a probe device or devices (not shown). The processing performed by the receiver processing module 344 can include, but is not limited to, digital intermediate frequency to baseband conversion, demodulation, demapping, depuncturing, decoding, and/or descrambling.

In an embodiment of the present invention, receiver processing module 344 and transmitter processing module 346 can be implemented via use of a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip. Such a memory device may be a read-only memory, random access memory, volatile memory, non-volatile memory, static memory, dynamic memory, flash memory, and/or any device that stores digital information. Note that when the processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

While the receiver processing module 344 and transmitter processing module 346 are shown separately, it should be understood that these elements could be implemented separately, together through the operation of one or more shared processing devices or in combination of separate and shared processing.

In another embodiment, the receiver and transmitter may share a multiple input multiple output (MIMO) antenna structure, diversity antenna structure, phased array or other controllable antenna structure that includes a plurality of antennas and other RF transceivers similar to RF transceiver 325. Each of these antennas may be fixed, programmable, an antenna array or other antenna configuration. Also, the antenna structure of the wireless transceiver may depend on the particular standard(s) to which the wireless transceiver is compliant and the applications thereof.

FIG. 4 illustrates a simple two antenna MIMO structure. A transmitting (Tx) unit 400 is shown having two antennas 401, 402, while a receiving (Rx) unit 403 is shown having two antennas 404, 405. It is to be noted that both transmitting unit 400 and receiving unit 403 are generally both transceivers, but are shown as a separate transmitter (Tx) and receiver (Rx) units for an exemplary purpose in FIG. 4. That is, Tx unit 400 is transmitting data and Rx unit 403 is receiving the transmitted data. The transmitted data symbols at antennas 401 ($Tx_0$), 402 ($Tx_1$) are noted as $S_0$ and $S_1$, respectively. The received data symbols at antennas 404 ($Rx_0$), 405 ($Rx_1$) are noted as $Y_0$ and $Y_1$ respectively. Since the example illustrates a two transmit antenna/two receive antenna MIMO system, the four resulting RF signal paths are noted as $H_{00}$, $H_{01}$, $H1_{10}$, and $H_{11}$ (using the $H_{Tx\text{-}Rx}$ notation) and the data path is referred to as channel H. While, the example illustrated is a two antenna structure, the embodiments disclosed herein may operate within other known antenna configurations (e.g., 2×4, 2×8, 4×16, etc.)

Further details including optional functions and features of the RF transceiver are discussed in conjunction with FIGS. 5-11 that follow.

Figure 5:
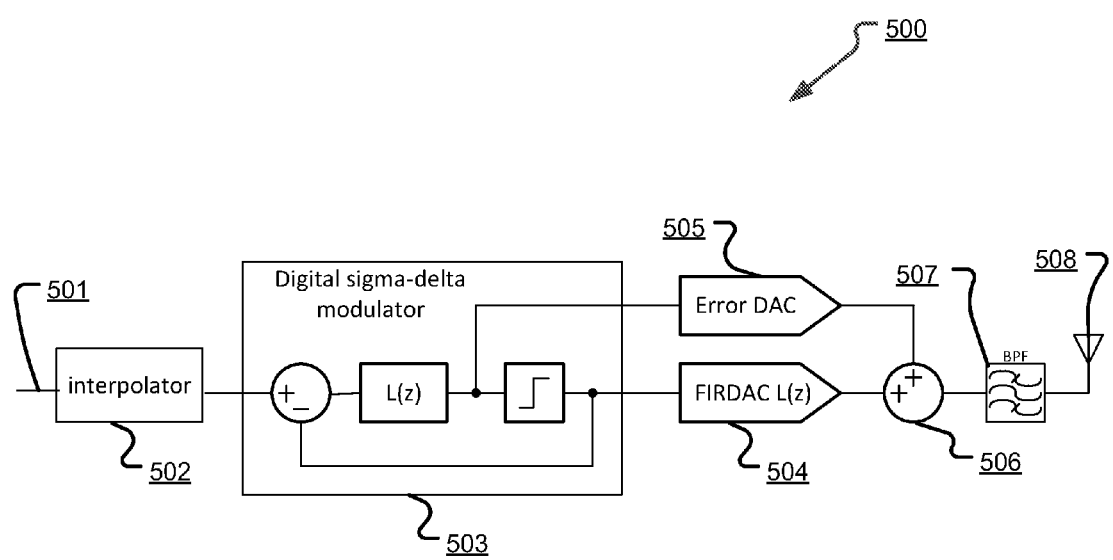
FIG. 5 shows an example embodiment of a transmitter employing the FIRDAC of the technology described herein.

FIG. 5 shows an example embodiment of a transmitter employing the FIRDAC of the technology described herein. In this example, specific frequencies selected, number of bands and bandwidth ranges can be modified without departing from the scope of the presently described embodiments.

As shown, a baseband signal 501 from a physical layer (PHY) is digitally interpolated and digitally up-converted to RF by interpolator 502. In an alternative embodiment, architectures with baseband or IF FIRDAC output followed by an analog up-conversion (not shown) are used. The output of interpolator 502 is passed to a digital sigma-delta modulator 503 to generate a reduced bitwidth (for example, 1-bit) signal to drive FIRDAC 504. Often an "error DAC" 505 path is also included to cancel the remaining sigma-delta modulator quantization noise—see for example Barkin et al. Typically, the digital processing is done at a reduced clock rate with a parallel architecture produced by loop unrolling, and is then followed by a serializer to produce the full-DAC-rate digital signal. DAC outputs from FIRDAC 504 are fed to bandpass filter 507 such as an LC filter, Q-enhanced LC filter, or BAW (bulk acoustic wave) filter and on to antenna 508 for transmission. A power amplifier (not shown) can also precede the antenna.

Delta-sigma ($\Delta\Sigma$) or sigma-delta ($\Sigma\Delta$) modulation is a method for encoding analog signals into digital signals or higher-resolution digital signals into lower-resolution digital signals. The conversion is done using error feedback, where the difference between the two signals is measured and used to improve the conversion. The low-resolution signal typically changes more quickly than the high-resolution signal and it can be filtered to recover the high-resolution signal with little or no loss of fidelity. This technique has found increasing use in modern electronic components such as converters, frequency synthesizers, switched-mode power supplies and motor controllers.

Both analog-to-digital converters (ADCs) and digital-to-analog converters (DACs) can employ delta-sigma modulation. A delta-sigma ADC first encodes an analog signal using delta-sigma modulation and then applies a digital filter to form a higher-resolution digital output. On the other hand, a delta-sigma DAC encodes a high-resolution digital input signal into a lower-resolution signal that is mapped to voltages and then smoothed with an analog filter. In both cases, the temporary use of a lower-resolution signal simplifies circuit design and improves efficiency.

Delta-sigma modulators are often used in digital-to-analog converters (DACs). In general, a DAC converts a digital number representing some analog value into that analog value. For example, the analog voltage level into a speaker may be represented as a 20 bit digital number, and the DAC converts that number into the desired voltage. To actually drive a load (like a speaker) a DAC is usually connected to or integrated with an electronic amplifier.

The SNR of sigma-delta ADC's using current-source-based DAC's is significantly limited by the thermal noise of the DAC current sources. DACs using a switched voltage connected via a resistor or other passive element are quieter, but in a non-return-to-zero configuration tend to suffer from intersymbol interference if used at GHz clock frequencies. The intersymbol interference can be avoided by using a return-to-zero or return-to-open drive. However, return-to-zero DACs tend to be vulnerable to clock jitter perturbing the edge timing and hence the energy in the pulse. This jitter sensitivity can be reduced by using multiple DACs clocked on successive half clock cycles (a finite-impulse-response DAC).

In the technology disclosed herein, various embodiments are disclosed using a finite-impulse-response digital-to-analog (FIRDAC) in a wireless transmitter DAC. FIRDACs, in an example embodiment, include a circuit composed of multiple DACs fed with delayed copies of the same signal. This ensures that a mismatch between component DACs only incurs a frequency response error, not a nonlinear distortion.

DACs can be single-bit or multiple-bit, however, single-bit DACs are inherently linear, and combining in a FIRDAC retains linearity, so the single-bit case is particularly important. Typically, the inputs can be scaled by different factors with the outputs are summed. The overall circuit behaviour is linear and implements a finite-impulse-response filter at the digital-to-analog interface. For example, DAC digital inputs are $a_0$ x[n], $a_1$ x[n−1], $a_2$ x[n−2], $a_3$ x[n−3]; analog output is y=$a_0$ x[n]+$a_1$ x[n−1]+$a_2$[n−2]+$a_3$ x[n−3]; frequency domain: $Y(z)=(a_0+a_1\ z^{-1}+a_2\ z^{-2}+a_3\ z^{-3})\ X(z)$. Sometimes this configuration is referred to as a "semi-digital reconstruction filter". FIRDACs, in this configuration, enjoy advantages such as filtering (shaping of frequency response) and reduced sensitivity to DAC clock jitter.

The ideal behavior of a DAC is to convert a digital input sequence r[0], r[1], r[2], r[n] into an analog output $x(t)=\Sigma_k$ h(t−kT) r[k] where T is the sampling period (=1/sample rate) and h(t) specifies the DAC pulse shape and its delay with respect to the input sequence. For example h(t)=1 for 0≤t<T and 0 otherwise for a basic DAC.

A FIRDAC consists of a plurality of DACs and digital logic to drive them. In an example three DAC embodiment, the DACs have outputs $x_1(t)=\Sigma_k h_1(t-kT)$ r[k], $x_2(t)=\Sigma_k h_2(t-kT)$ r[k], $x_3(t)=\Sigma_k h_3(t-kT)$ r[k] where the key point is that the input r[k] is consistent (that is, not $r_1$[k], $r_2$[k], $r_3$[k] but rather a common r[k]), but the DAC pulse delays/shapes $h_1(t)$, $h_2(t)$, $h_3(t)$ differ. For example $h_1(t)$=1 for 0≤t<T and 0 otherwise, $h_2(t)$=1 for T≤t<2T and 0 otherwise and $h_3(t)$=1 for 2T≤t<3T and 0 otherwise. The DAC output pulses are then linearly combined into an overall output y(t) by an analog network. At its simplest this network can be a trivial parallel interconnection of the outputs of current DACs producing an instantaneous sum $y(t)=k_1\ x_1(t)+k_2\ x_2(t)+k_3\ x_3(t)$ by Kirchoff's current law, but still a FIRDAC if the network includes some dynamic behavior.

In the technology disclosed herein, various embodiments are disclosed using return-to-zero, return-to-open, voltage-mode or a combination thereof, DAC cells (DACs). In addition, in some embodiments, outputs of DAC cells are combined using a summing circuit comprising an arbitrary passive analog network of linear, time-invariant, passive components (e.g., resistors, capacitors, inductors, or a combination thereof). These embodiments provide less thermal noise than current DAC implementations.

Figure 6:
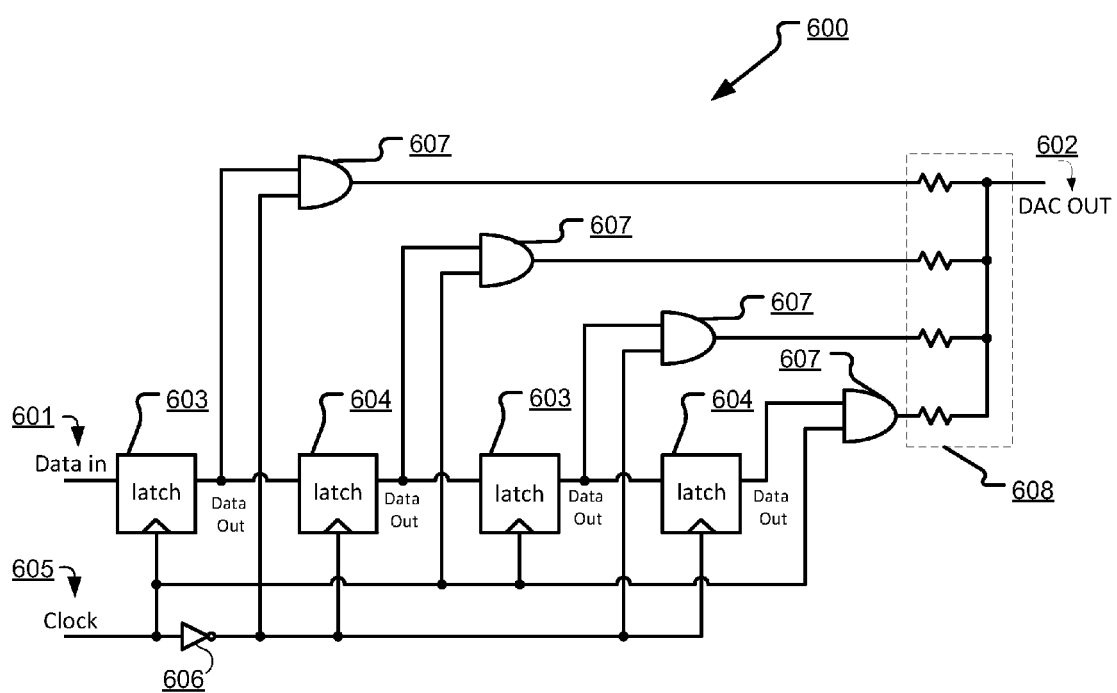
FIG. 6 shows an example embodiment of a single-bit FIR-DAC.

FIG. 6 shows an example embodiment of a single-bit FIRDAC. As shown, single-bit FIRDAC 600 includes digital data input signal(s) 601 and DAC output signal(s) 602. A series of latches 603 and 604 (digital storage elements) are arranged to provide half-cycle and whole-cycle delays of copies of digital data input signal 601. Odd latches 603 (i.e., 1, 3, 5, etc.) are driven by clock signal 605. Even latches 604 (i.e., 2, 4, etc.) are driven by inverted (compliment) clock signal 606 which is transparent when clock is high and latched when clock is low. The single-bit structure employs an AND gate 607 at the output of each latch 603 or 604. The AND gates 607 receive the data out and are used to implement return-to-zero voltages. Return-to-zero (RTZ) describes telecommunications signals in which the signal drops (returns) to zero between each pulse. This takes place even if a number of consecutive 0's or 1's occur in the signal. The definition of "return-to-zero" given the discussion above is that h(t) is non-zero for a duration less than the full clock cycle T. "Voltage-mode" means the x(t) are voltages, i.e., the DAC has a low output impedance. AND gates 607, also receiving clock signal 605 or alternately the inverted clock signal 606 (as shown), are used as voltage-mode DAC elements. A resistive summer 608 provides a summed DAC output signal 602.

The example embodiment circuit shown in FIG. 6 can be implemented in various configurations. Typical implementations will be differential, i.e., latches with differential outputs and AND gates and resistors for both + and − latch output. This also makes reference-supply currents signal-independent, which avoids disrupting the reference.

Although a 50% duty-cycle clock and ANDing of the data with the clock (or its complement) is one embodiment to implement the return-to-zero, other embodiments include a higher-frequency clock combined with a DAC pulse that is constant for n half-cycles, then zero for m half-cycles.

Figure 7:
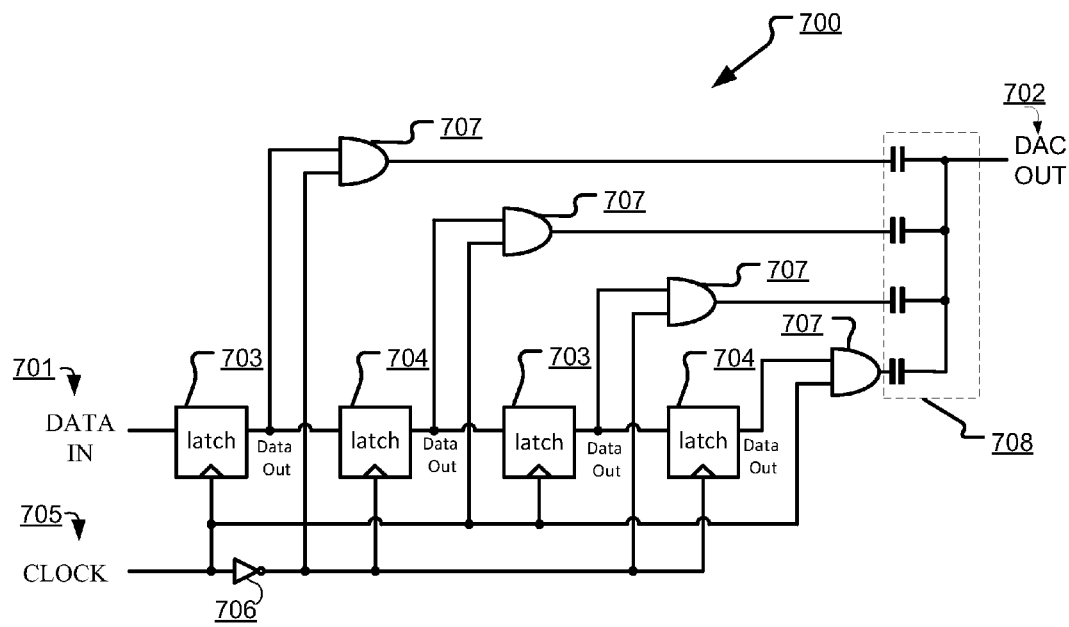
FIG. 7 shows another embodiment of a single-bit FIRDAC with capacitors replacing the resistors of FIG. 6.

For bandpass (e.g., radio frequency (RF)) output, one embodiment employs capacitors in place of resistors (described hereafter with FIG. 7 description). This is a particularly low-noise structure. The capacitors are not switched so there is no kT/C noise, as opposed to switched-capacitor implementations. In addition, this embodiment provides power-efficiency with a tuned (L or LC) load.

FIG. 7 shows another embodiment of a single-bit FIRDAC with capacitors replacing the resistors of FIG. 6. As shown, single-bit FIRDAC 700 includes digital data input signal(s) 701 and DAC output signal(s) 702. A series of latches 703 and 704 are arranged to provide half-cycle and whole-cycle delays of copies of digital data input signal 701. Odd latches 703 (i.e., 1, 3, 5, etc.) are driven by clock signal 705. Even latches 704 (i.e., 2, 4, etc.) are driven by inverted (compliment) clock signal 706 which is transparent when clock is high and latched when clock is low. The single-bit structure employs an AND gate 707 at the output of each latch 703 or 704. The AND gates 707 receive the data out and are used to implement return-to-zero voltages. As previously mentioned, return-to-zero (RTZ) describes telecommunications signals in which the signal drops (returns) to zero between each pulse. This takes place even if a number of consecutive 0's or 1's occur in the signal. AND gates 707, also receiving clock signal 705 or alternately the inverted clock signal 706 (as shown), are used as voltage-mode DAC elements. A capacitive summer 708 provides a summed DAC output signal 702.

Figure 8:
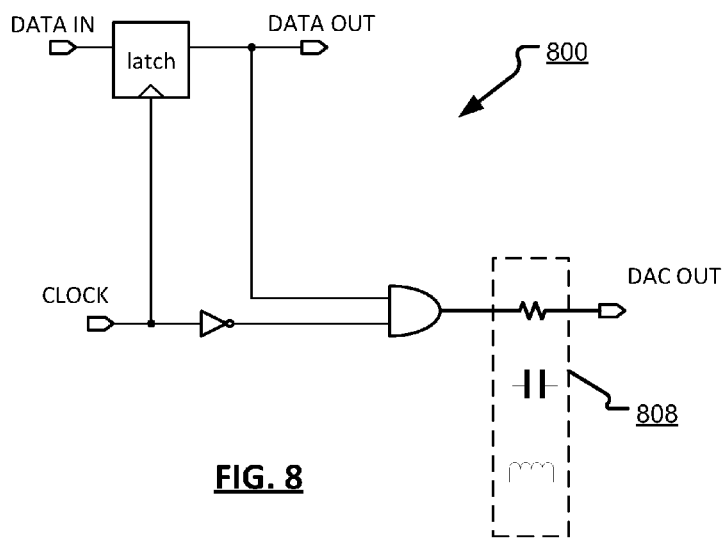
FIG. 8 shows a basic individual cell structure of a return-to-zero single finite-impulse-response (FIR) cell as shown in FIGS. 6 and 7.

FIG. 8 shows the basic individual cell structure 800 of the return-to-zero single finite-impulse-response (FIR) cell as shown in FIGS. 6 and 7 for the presently described technology.

The use of resistors or capacitors can be generalized to an arbitrary passive analog network 808 (the arbitrary passive analog element is any of or a combination of: a resistor, capacitor and inductive element) that takes the outputs of DACs fed with delayed copies of the same signal. Using an inductive summer results in low-noise and power-efficient for low-pass modulators.

Figure 9:
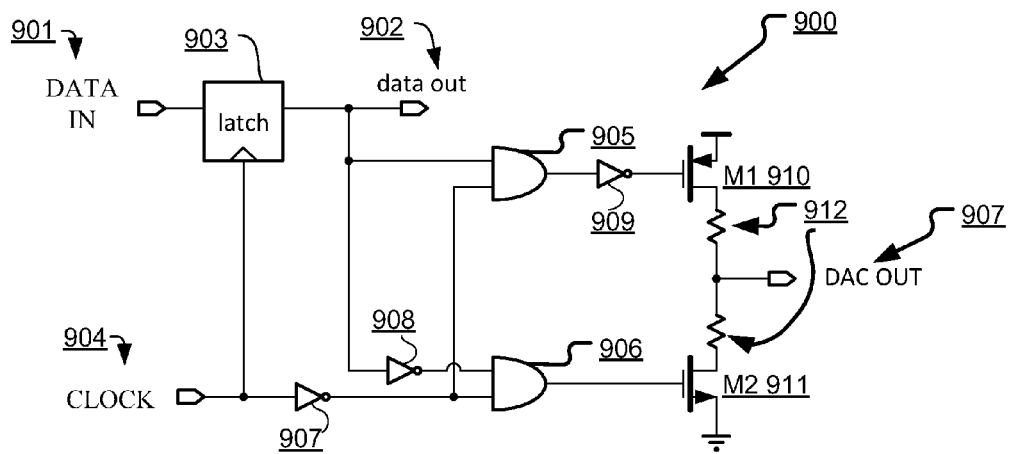
FIG. 9 shows another embodiment of an individual finite-impulse-response (FIR) cell for a single-bit FIRDAC where DAC output returns-to-open (RTO).

FIG. 9 shows another embodiment of an individual finite-impulse-response (FIR) cell for a single-bit FIRDAC where DAC output returns-to-open (RTO) rather than to zero voltage. This embodiment additionally reduces output thermal noise. As shown, single-bit FIR cell 900 includes digital data input signal(s) 901, data output signal(s) 902 and DAC output signal(s) 907. Latch 903 provides a half-cycle delay of copies of digital data input signal 901. Latch 903 is driven (clocked) by clock signal 904. The return-to-open circuit structure employs AND gates 905 and 906 receiving the data output and inverted data output 908 of latch 903, respectively. AND gates 905 and 906 are used to implement a return-to-open signal in conjunction with an inverted 907 clock input. Outputs from AND gate 905 (inverted 909) and AND gate 906 are fed to transistors M1 910 and M2 911, respectively. The DAC data output signal 907 is a common output from M1 910 and M2 911 through resistors 912.

Figure 10:
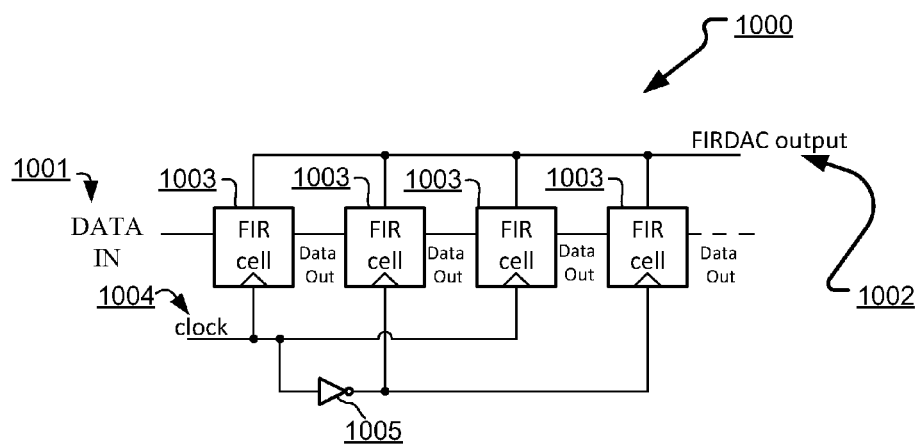
FIG. 10 shows a generalized embodiment of a complete single-bit FIRDAC.

FIG. 10 shows a generalized embodiment of a complete single-bit FIRDAC 1000. In this embodiment, the FIR cells 1003 can be either the return-to-zero configuration of latch and AND gate 800 as shown in FIG. 8 or the return-to-open FIR cell structure 900 as shown in FIG. 9. As shown, single-bit FIRDAC 1000 includes digital data input signal(s) 1001 (e.g., from a comparator) and FIRDAC output signal(s) 1002. A series of FIR cells 1003 are arranged to provide delayed (e.g., half-cycle) copies of digital data input signal 1001. Alternating FIR cells 1003 are driven (clocked) by clock signal 1004 and inverted clock signal 1005, respectively.

Figure 11:
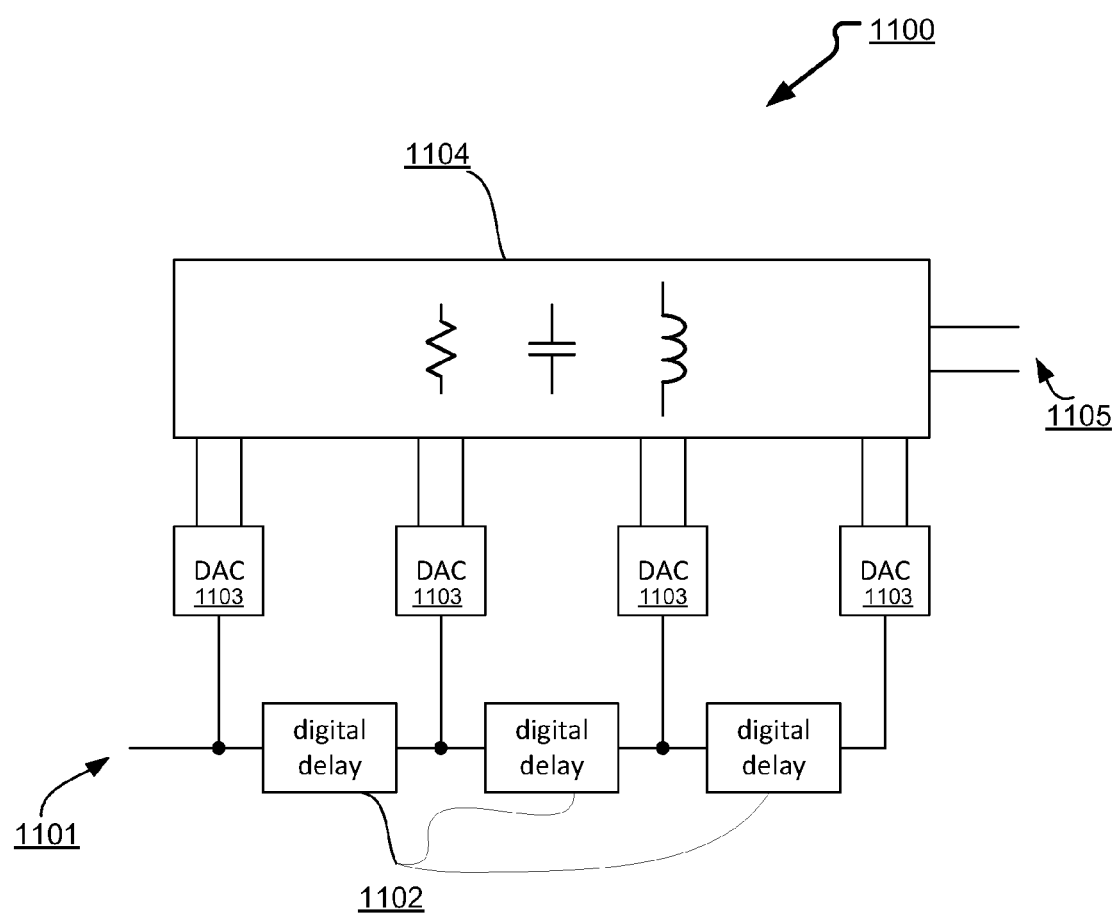
FIG. 11 shows a simplified embodiment of the FIRDAC as described in the various embodiments herein.

FIG. 11 shows a simplified embodiment of the FIRDAC as described in the various embodiments herein. In this simplified embodiment 1100, a digital data signal input 1101 is supplied to a first of three or more (four shown) digital-to-analog (DAC) elements 1103. Subsequent DACs are configured to receive a delayed 1102 copy of the digital data signal and produce an output analog signal 1105 from a summed output (through arbitrary passive analog network 1104) of each the DAC elements.

The various embodiments described herein can be fully implemented in, but not limited to: an RF receiver, RF transmitter, RF transceiver, user equipment transceiver, base station transceiver, wireless transceiver, LTE transceiver, MIMO transceiver, sigma-delta ADC (FIRDAC has both filtering and DAC functions so it can be used as part (or all) of the loop filter) and bandpass RF DACs for transmitters. In one embodiment, a one-bit FIRDAC would be combined with a digital sigma-delta modulator, digital subtractor and error DAC.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operatively connected", "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship.

As may also be used herein, the terms "processing module", "processing circuit", and/or "processing unit" may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The technology as described herein has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as CMOS, as one of ordinary skill in the art will appreciate, the transistors may be implemented using any type of transistor structure including, but not limited to, bipolar, field effect (FET) or metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

While particular combinations of various functions and features of the technology as described herein have been expressly described herein, other combinations of these features and functions are likewise possible. The technology as described herein is not limited by the particular examples disclosed herein and expressly incorporates these other combinations.

The invention claimed is:

1. A finite impulse response digital-to-analog converter (FIRDAC) comprising:
   a digital data signal input;
   a series of two or more digital storage elements, the two or more digital storage elements operably connected;
   the digital data signal input connected to a first of the series of two or more of digital storage elements with each of the two or more digital storage elements configured to provide delayed copies of the digital data signal input to a next operably connected digital storage element;
   a series of digital-to-analog (DAC) and AND elements each sequentially paired to a respective one of the two or more of digital storage elements and configured to receive the delayed copies of the digital data signal from a respective paired digital storage element and further configured to receive an alternating state clocking input signal with the state based on position within the series;
   a passive analog network connected to an output of each of the series of digital-to-analog (DAC) and AND elements; and
   wherein the output from each one in the series of digital-to-analog (DAC) and AND elements is summed using the passive analog network to produce an output analog signal.

2. The finite impulse response digital-to-analog converter (FIRDAC), as per claim 1, wherein the series of digital-to-analog (DAC) and AND elements paired to a respective one of the series of two or more of digital storage elements produces operably connected finite impulse response (FIR) cells.

3. The finite impulse response digital-to-analog converter (FIRDAC), as per claim 1, wherein each of the series of two or more of digital storage elements comprises latches and each one of the series of digital-to-analog (DAC) and AND elements comprise AND gates.

4. The finite impulse response digital-to-analog converter (FIRDAC), as per claim 1, wherein the series of digital-to-analog (DAC) and AND elements comprise any of: voltage mode elements, return-to-zero (RTZ) voltage mode elements, and return-to-open (RTO) voltage mode elements.

5. The finite impulse response digital-to-analog converter (FIRDAC), as per claim 1, wherein the passive analog network is any of or a combination of linear, time-invariant, passive components.

6. The finite impulse response digital-to-analog converter (FIRDAC), as per claim 1, wherein the series of digital-to-analog (DAC) and AND elements comprise return-to-open (RTO) elements.

7. The finite impulse response digital-to-analog converter (FIRDAC), as per claim 6, wherein each of the series of two or more digital storage elements comprises a latch and the FIRDAC with return-to-open (RTO) elements comprises:
   each of the latches receiving the digital data signal input and the clock or compliment clock signal respectively depending on odd or even position in the operable connection;
   a first AND gate for receiving a data out signal from the latch in conjunction with the clock or compliment clock signal depending on odd or even position in the operable connection, the first AND gate producing an output which is inverted and passed to a first transistor;
   a second AND gate for receiving a compliment data out signal from the latch in conjunction with the clock or compliment clock signal depending on odd or even position in the operable connection, the second AND gate producing an output which is passed to a second transistor; and
   a passive element from each of the first and second transistors connected to produce the DAC output signal.

8. The finite impulse response digital-to-analog converter (FIRDAC), as per claim 1, wherein the FIRDAC is operable in any of: an RF receiver, RF transmitter, RF transceiver, user equipment transceiver, base station transceiver, wireless transceiver, LTE transceiver, MIMO transceiver, sigma-delta analog-to-digital (ADC), digital sigma-delta modulator and bandpass RF DACs for transmitters.

9. A method to convert digital data input signals to analog output signals, the method comprising:
   receiving the digital data input signals;
   latching the digital data input signals to generate a delayed copy of the digital data input signals;
   ANDing, in a first step, the delayed copy with an inverted state clocking input signal, the first step producing an output which is inverted and passed to a first transistor;
   ANDing, in a second step, an inversion of the delayed copy with an inverted state clocking input signal, the second step producing an output which is passed to a second transistor; and
   connecting outputs from the first and second transistors to one or more passive elements to produce analog output signals.

10. The method to convert digital data input signals to analog output signals, as per claim 9, wherein the one or more passive elements includes any of or a combination of: a resistor, a capacitor and an inductive element.

11. The method to convert digital data input signals to analog output signals, as per claim 9, wherein the method is operable in any of: an RF receiver, RF transmitter, RF transceiver, user equipment transceiver, base station transceiver, wireless transceiver, LTE transceiver, MIMO transceiver, sigma-delta analog-to-digital (ADC), digital sigma-delta modulator and bandpass RF DACs for transmitters.

12. The method to convert digital data input signals to analog output signals, as per claim 9, wherein the method is operative in a finite impulse response digital-to-analog converter (FIRDAC).

13. The method to convert digital data input signals to analog output signals, as per claim 9, wherein the method is operative in a return to open finite impulse response cell.

14. The method to convert digital data input signals to analog output signals, as per claim 13, wherein the method is operative in a plurality of operatively connected return to open finite impulse response cells.

15. A single bit finite impulse response digital-to-analog converter (FIRDAC) comprising:
   a digital data signal input;
   a clock input and a compliment of the clock input;
   a plurality of finite impulse response (FIR) cells, the plurality of FIR cells connected in series and comprising return-to-zero (RTZ) elements;
   the clock input clocking odd FIR cells in the plurality of FIR cells connected in series;
   the compliment of the clock input clocking even FIR cells in the plurality of FIR cells connected in series;
   the plurality of FIR cells connected in series configured to provide delayed copies of the digital data input signal to each FIR cell, and
   wherein a DAC output from each FIR cell is combined in a linear, time invariant manner to produce a FIRDAC output.

16. The single bit finite impulse response digital-to-analog converter (FIRDAC), as per claim 15, wherein the plurality of FIR cells connected in series with return-to-zero (RTZ) elements each comprise:
   a latch for receiving the digital data signal input, the latch driven by the clock or the compliment clock signal respectively depending on odd or even position in the plurality of FIR cells connected in series;
   an AND gate for receiving a data out signal from the latch in conjunction with the clock or the compliment clock signal depending on odd or even position in the plurality of FIR cells connected in series; and
   a passive analog element in series with an output from the AND gate.

17. The single bit finite impulse response digital-to-analog converter (FIRDAC), as per claim 16, wherein the passive analog element is any of or a combination of a resistor, capacitor and inductive element.

18. The single bit finite impulse response digital-to-analog converter (FIRDAC), as per claim 15, wherein the return-to-zero (RTZ) elements comprise return-to-open (RTO) elements.

19. The single bit finite impulse response digital-to-analog converter (FIRDAC), as per claim 18, wherein the plurality of FIR cells connected in series with return-to-open (RTO) elements each comprise:
   a latch for receiving the digital data signal input, the latch driven by the clock or the compliment clock signal respectively depending on odd or even position in the plurality of FIR cells connected in series;
   a first AND gate for receiving a data out signal from the latch in conjunction with the clock or the compliment clock signal depending on odd or even position in the plurality of FIR cells connected in series, the first AND gate producing an output which is inverted and passed to a first transistor;
   a second AND gate for receiving a compliment data out signal from the latch in conjunction with the clock or the compliment clock signal depending on odd or even position in the plurality of FIR cells connected in series, the second AND gate producing an output which is passed to a second transistor; and a resistive element from each of the first and second transistors connected to produce the FIRDAC output signal.

20. The single bit finite impulse response digital-to-analog converter (FIRDAC), as per claim 15, wherein the single bit FIRDAC is operable in any of: an RF receiver, RF transmitter, RF transceiver, user equipment transceiver, base station transceiver, wireless transceiver, LTE transceiver, MIMO transceiver, sigma-delta analog-to-digital (ADC), digital sigma-delta modulator and bandpass RF DACs for transmitters.

* * * * *

UNITED STATES PATENT AND TRADEMARK OFFICE
CERTIFICATE OF CORRECTION

| | | |
|---|---|---|
| PATENT NO. | : 8,736,475 B1 | Page 1 of 1 |
| APPLICATION NO. | : 13/646879 | |
| DATED | : May 27, 2014 | |
| INVENTOR(S) | : Jeffrey Harrison | |

It is certified that error appears in the above-identified patent and that said Letters Patent is hereby corrected as shown below:

In The Claims

Col. 12, line 39, in claim 1: after "digital-to-analog (DAC)" delete "and"
Col. 12, line 47, in claim 1: after "digital-to-analog (DAC)" delete "and"
Col. 12, line 50, in claim 1: after "digital-to-analog (DAC)" delete "and"
Col. 12, line 55, in claim 2: after "analog (DAC)" delete "and"
Col. 12, line 61, in claim 3: after "digital-to-analog (DAC)" delete "and"
Col. 12, line 65, in claim 4: after "analog (DAC)" delete "and"
Col. 13, line 7, in claim 6: after "analog (DAC)" delete "and"

Signed and Sealed this
Twenty-third Day of June, 2015

Michelle K. Lee
*Director of the United States Patent and Trademark Office*